United States Patent [19]
Ahmed

[11] 3,989,997
[45] Nov. 2, 1976

[54] ABSOLUTE-VALUE CIRCUIT
[75] Inventor: Adel Abdel Aziz Ahmed, Annandale, N.J.
[73] Assignee: RCA Corporation, New York, N.Y.
[22] Filed: July 3, 1975
[21] Appl. No.: 593,115

[52] U.S. Cl. ............................. 321/47; 307/313; 323/1; 330/30 D
[51] Int. Cl.² ................................. H02M 7/21
[58] Field of Search .............. 321/20, 46, 47; 323/1, 323/4, 9; 307/260, 261, 313; 330/30 D

[56] References Cited
UNITED STATES PATENTS
3,564,389  2/1971  Richman ............................ 321/47
3,876,955  4/1975  Ahmed ................................ 323/1

OTHER PUBLICATIONS
RCA Tech Notes TN No. 913, Aug, 24, 1972, "Transformerless Full-wave Rectifier" by Wheatley, Jr., two pages.

Primary Examiner—Gerald Goldberg
Attorney, Agent, or Firm—H. Christoffersen; S. Cohen; F. R. Perillo

[57] ABSTRACT

The circuit comprises three current mirrors, the first and second having at least two output current paths and the third, one output current path. The first mirror is complementary to the second and supplies its output currents to the second. The signal current is applied to the second mirror and affects the output currents of the second mirror. The third mirror has an input circuit which serves as a shunt path for one of the output currents supplied by the first mirror in excess of that which the second mirror can accept and an output circuit which, under the same conditions, receives a portion of the second output current supplied by the first mirror. The load, through which flows a current which has the absolute value of the signal current, is coupled to the output terminal of the third mirror.

16 Claims, 4 Drawing Figures

ABSOLUTE-VALUE CIRCUIT

Circuits for obtaining the absolute value of an input signal have many applications. Full wave rectification is one. When realized in integrated circuit form, such circuits should be designed without transformers as the latter cannot easily be integrated.

It is known in the prior art to realize transformerless circuits of this kind with operational amplifiers and diodes. A schematic diagram of one such circuit is shown at page 120 of "Applications of Operational Amplifiers, Third Generation Techniques" by Graeme, McGraw Hill. This circuit has limited usefulness when a current source output is desired, as would be the case, for example, if the absolute value circuit were used in integrated circuit form to provide driving signals to other integrated devices. In addition, the supply voltage requirements of the reference circuit may be too large to be compatible with available supply voltages in integrated circuits operating in the current mode.

Figure 1:
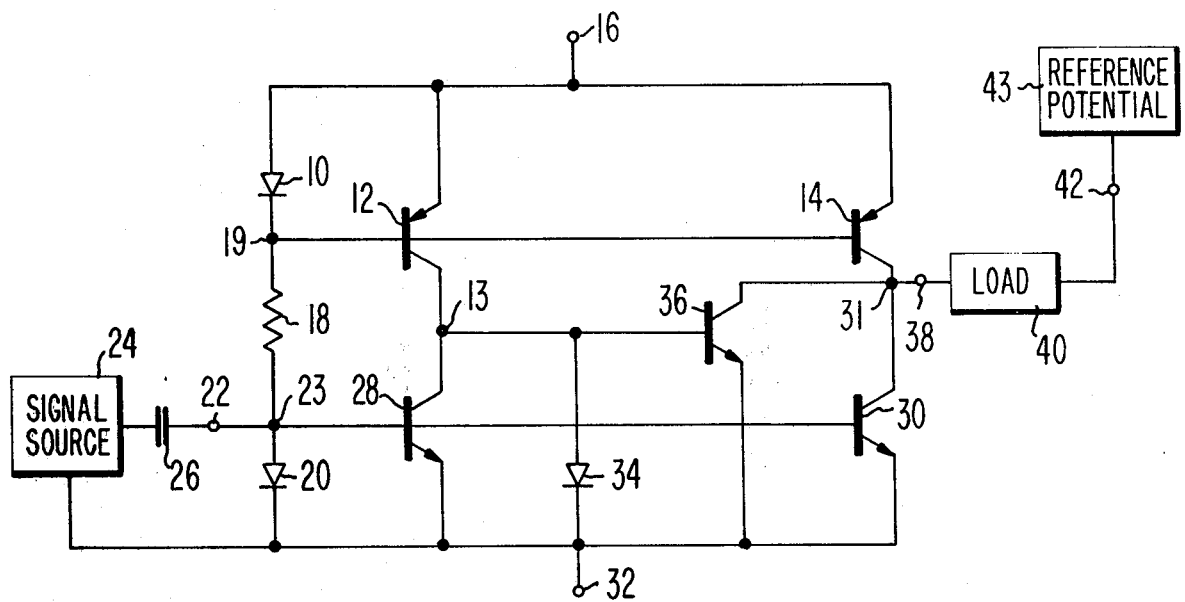
FIGS. 1 and 2 are schematic circuit diagrams of two different embodiments of the invention.

In the circuit of FIG. 1, diode 10 and PNP transistors 12 and 14 comprise a first current mirror amplifier. The anode of diode 10 and the emitter of transistors 12 and 14 are connected to the mirror common terminal 16 which in turn is connected to a source of operating potential (not shown). The cathode of diode 10 and the bases of transistors 12 and 14 are connected to the mirror input terminal 19. Diode 20 and NPN transistors 28 and 30 comprise a second current mirror amplifier which is complementary to the first such amplifier. The input node 23 of this mirror is coupled to the first mirror input node 19 by resistor 18. Also connected to node 23 is input terminal 22, the anode of diode 20 and the bases of transistors 28 and 30. Input terminal 22 is connected to signal source 24 through coupling capacitor 26. Alternatively, the input signal source may be direct conductively coupled to node 23 in the case where a current signal is supplied by a source of high internal impedance. The cathode of diode 20 and the emitters of transistors 28 and 30 are connected to a circuit common terminal 32 which in turn is connected to a second source of operating potential (not shown), which source may be ground potential.

Diode 34 and NPN transistor 36 comprise a third current mirror amplifier. The anode of diode 34 and the base of transistor 36 are connected to mirror input node 13. The cathode of diode 34 and the emitter of transistor 36 are connected to terminal 32 which comprises the mirror common terminal. Also connected to node 13 are the first output nodes of the first and second current mirrors, these nodes being connected to the collectors of transistors 12 and 28, respectively. The output node of the third current mirror and the second output nodes of the first and second current mirrors, these nodes being connected to the collectors of transistors 36, 14 and 30, respectively, are interconnected at node 31. Node 31 is also connected through circuit output terminal 38 to a load 40 which in turn may be connected through terminal 42 to a source of an arbitrary reference potential 43 which is relatively positive compared to the potential at common terminal 32 and relatively negative compared to the source of operating potential at terminal 16.

In the operation of the circuit of FIG. 1, assume initially that the value of the input signal S is zero. An input current I is established in the first and second mirrors whose value is determined primarily by the voltage across terminals 16 and 32 and the value of resistor 18. This current, which flows through diode 10, resistor 18 and diode 20, is arranged to have a value in excess of the magnitude of the input signal. The geometry of transistors 12 and 14, as well as transistors 28 and 30, is chosen such that the output currents of the first and second mirrors also equal I. The geometry of transistor 36 is chosen such that the output current of the third mirror equals twice its input current. The output current of this mirror is zero when no input signal is present. This is because a current I is flowing into node 13 from transistor 12 and a current I is flowing out of node 13 into transistor 28, resulting in zero input current to the third mirror. The load current is also zero for this input signal condition because transistor 30 is accepting the entire output current I flowing from the collector of transistor 14. It should be appreciated that when the circuit of FIG. 1 and circuits to be subsequently described, are realized in integrated circuit form, each diode may be realized by using a transistor with its base and collector regions connected together.

Assume now that an input signal current +S is flowing from source 24 into terminal 22. Current flow in this direction is arbitrarily defined as positive current. This current together with the bias current I results in an input current to the second mirror of I+S. This should also be the value of current through transistor 28. However, the collector current supply available for transistor 28 is limited to the value I, which is the current flowing into node 13 from transistor 12. Transistor 28 attempts to draw the additional current through diode 34 in a direction tending to turn this diode off. Therefore, for a positive input signal, the current through the third mirror is zero. Since the collector current demand of transistor 28 is greater than the available collector current, this device saturates. At saturation, the emitter-to-collector potential of transistor 28 is at a value (less than $1V_{BE}$) too low to support conduction through diode 34. Therefore, it and transistor 36 remain cut off.

An input current I+S in the second mirror also causes a current of the same value to flow at its second output node. Looking at the current flow at node 31, a current I is flowing into this node through transistor 14. Each of transistors 12 and 14 functions as a source of constant current, I. A current I+S is flowing away from the node through transistor 30. The current through transistor 36 is zero. Since the sum of currents at this node must equal zero, a current whose value is S must flow from source 43 through the load 40 into node 31. The source 43 thus functions as an additional source of current.

Assume now that a current S is flowing through terminal 22 towards signal source 24. Current flow in this direction is defined as negative current. The value of the second mirror input current is I-S. This causes the first output current of this mirror to also equal I-S. A current I is flowing into node 13 from the first mirror and a current I-S is flowing away from node 13 into the second mirror. This results in an input current of value +S to the third mirror which in turn causes a current of 2S to flow at the output of this mirror.

The second output current of the second current mirror, that is, the collector current of transistor 30, is also I-S. Looking once more at the current flow at node 31, a current I still flows into this node from the first mirror (the collector current of transistor 14). A portion of this current, I-S, flows into the second mirror (into the collector electrode of transistor 30). The remainder of this current S flows into the third mirror (into the collector electrode of transistor 36). However, since the value of the output current of this mirror must be 2S, the remainder of this current S must flow from source 43 through load 40 into node 31 and thence into transistor 36. It should be noted that the direction of this current flow through load 40 is the same as that for the positive signal applied to terminal 22. Therefore, full wave rectification of the input signal has been achieved.

There are several potential shortcomings in the circuit of FIG. 1. The input currents to the first and second current mirrors should ideally be equal. This means equal current through diodes 10 and 20. However, the current through the latter includes the base current of transistors 12 and 14 in addition to the current flowing through diode 10. The effects of this additional current may generally be ignored where high gain transistors are used. However, when the circuit of FIG. 1 is realized in integrated circuit form, transistors 12 and 14 will be PNP lateral transistors. Because of the relatively low current gain (beta) of these devices, of the order of 5 to 20, the base current from each device may be a relatively appreciable portion of the current I flowing through diode 10. This additional current $\Delta I$ through diode 20 increases the input current to the second mirror. As a result, with an input signal equal to zero, a current I flows into node 31 and a current I+$\Delta I$ flows away from this node. This causes a current $\Delta I$ to flow into node 31 through load 40 which may be a significant percentage of the normal load current.

Another shortcoming of the circuit of FIG. 1 is the tendency of transistor 28 to saturate. As mentioned earlier, saturation occurs for positive input signals because transistor 12 cannot supply enough collector current to transistor 28. The effect of saturation is to make transistor 28 look like a second diode, which has a series resistance associated with it corresponding to its base resistance in parallel with the diode 20. Saturation therefore has the effect of increasing the effective area of the reference diode that establishes the input current of the second mirror, which results in a lower output current for this mirror. This in turn reduces the load current during positive input signal intervals.

Figure 2:
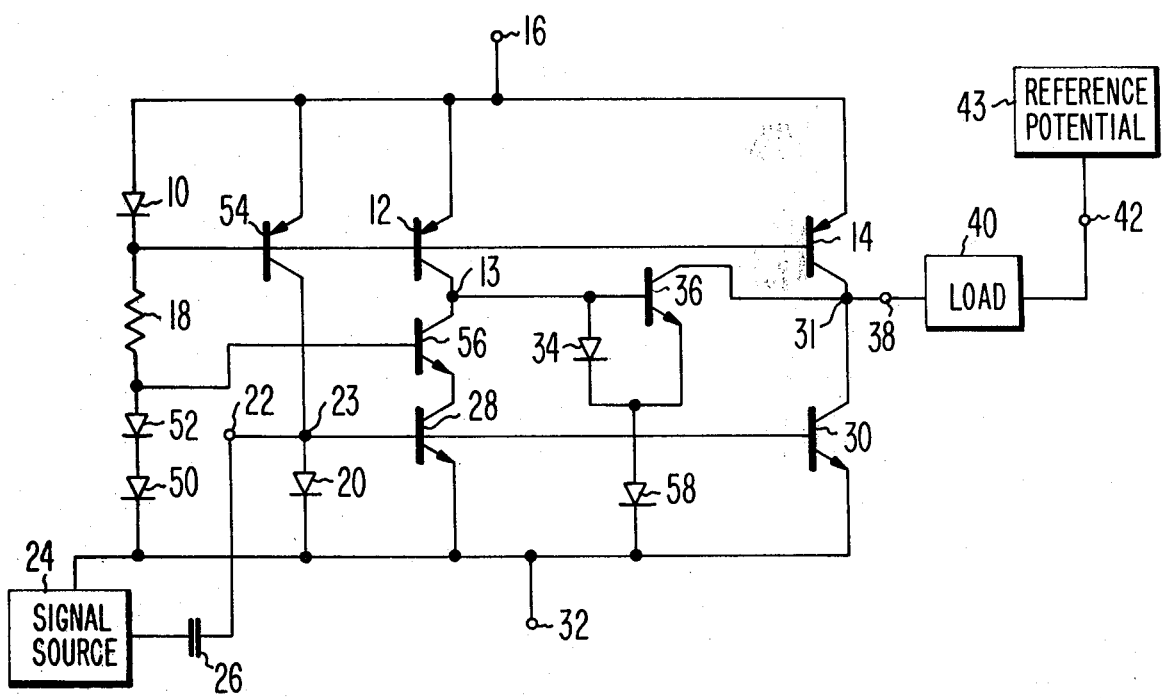

The shortcomings above may be avoided with the circuit of FIG. 2. Elements common to the circuits of FIGS. 1 and 2 are identified by the same reference numbers. In addition, this circuit also includes other elements, as follows. The collector-emitter path of NPN transistor 56 is connected between node 13 and the collector of transistor 28. The common terminal of the third current mirror is now connected to the anode of diode 58 instead of terminal 32 while the cathode of 58 is connected to terminal 32. There is a third output circuit in the first mirror comprising the collector-emitter path of PNP transistor 54 which is connected between terminal 16 and the input to the second mirror. Connected to the first mirror input terminal are the bases of transistors 54, 12 and 14 as well as one terminal of resistor 18. The other terminal of resistor 18 is connected to the base of transistor 56 and the anode of diode 52. The cathode of diode 52 is connected through the anode-cathode path of diode 50 to terminal 32.

In the operation of the circuit of FIG. 2, transistor 54 prevents a flow of base current from transistor 12 and 14 into the input node of the second current mirror. Instead, the base currents of transistors 52, 12 and 14 flow through a path, comprising resistor 18 and diodes 50 and 52, that has substantially no effect on the load current.

The purpose of the additional transistor 56 is to prevent the saturation of transistor 28. The base of transistor 56 is held at a voltage $2V_{BE}$ above the potential at terminal 32, where $V_{BE}$ equals the potential drop across a forward biased diode. This in turn means that the emitter of transistor 56 and the collector of transistor 28 will be held at $1V_{BE}$ above the potential at terminal 32. Since the collector of transistor 28 is held at this potential, it cannot saturate and the gain of the second current mirror amplifier remains unaffected.

Figure 4:
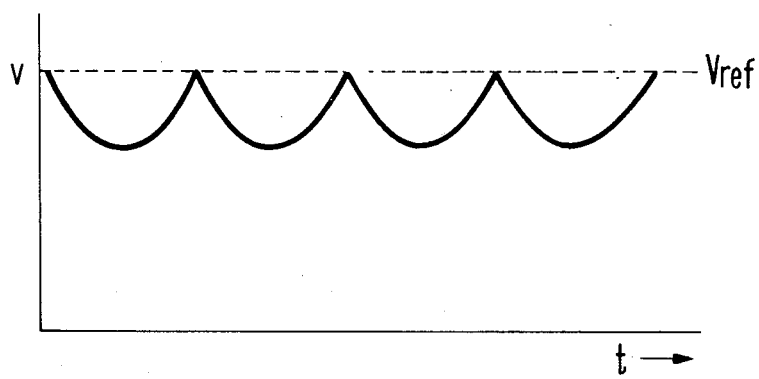
FIG. 4 is a drawing of a waveform present in the circuits of FIGS. 1 and 2.

Diode 58 is needed to hold the collector of transistor 56 at a voltage $2V_{BE}$ above the voltage at terminal 32. The base of this transistor is biased at a voltage $2V_{BE}$ above the voltage at terminal 32. If diode 58 were not present, the collector of transistor 56 would be at a lower potential than its base, resulting in forward biasing of the collector-base junction. Such a bias condition represents transistor saturation. Transistor 56 would remain saturated at all times, thereby preventing proper operation of the circuit of FIG. 2. Transistor 56 will saturate for positive input signals for reasons similar to those given for the saturation of transistor 28 in the operation of the circuit of FIG. 1. As transistor 56 is driven towards saturation, diodes 34 and 58 are cut off for the same reason that diode 34 is cut off in the circuit of FIG. 1. Except for the above-described differences, the operation of the circuit of FIG. 2 is similar to the operation of the circuit of FIG. 1, resulting in an output waveform similar to that shown in FIG. 4.

Figure 3:
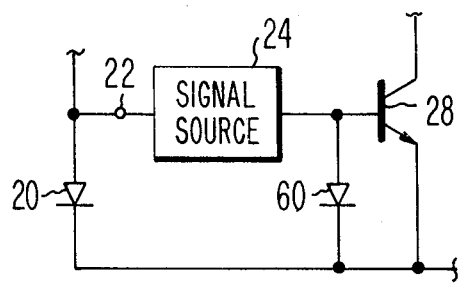
FIG. 3 is a modification to a portion of the circuit of FIG. 2.

The circuits of FIGS. 1 and 2 show the signal source 24 being coupled to input terminal 22 through a coupling capacitor 26. While this capacitor may not be necessary in all situations, it is generally required where the signal source constitutes a voltage generator having a different direct current voltage level than the input terminal. Since it is generally desirable to avoid capacitors in integrated circuits, FIG. 3 presents a modification to the circuit of FIG. 2 which permits the source to be directly connected to input terminal 22 without the use of a coupling capacitor. Source 24 is connected between input terminal 22 and the base of transistor 28. Also connected to the base of transistor 28 is the anode of diode 60. The cathode of this diode is, in turn, connected to terminal 32. Source 24 is now referenced to identical dc potentials and the need for the coupling capacitor is eliminated.

The addition of diode 60 will modify the mirroring ratio between diode 20 and transistors 28 and 30. From a dc standpoint, diodes 20 and 60 may be considered in parallel. If these diodes are of equal base-emitter areas, the effect will be to halve the mirroring ratio, resulting in a current of I/2 rather than I through transistors 28 and 30. To avoid this, the geometry of transistor 54 of the circuit of FIG. 2 must be modified such that its mirroring ratio with respect to diode 10 is 2. This results in a bias current of 2I flowing through the parallel combination of diodes 20 and 60, which in turn results in the desired current I flowing through transistors 28 and 30. The case where a current signal source of high internal impedance is used does not require these additional elements for direct coupling of the source to the input terminal.

The circuits of FIGS. 1 and 2 realize a full wave rectifier function without the need for a transformer. In addition, transitor betas obtainable with conventional integrated circuit fabrication techniques are suitable for this circuit. The rectifier gain can be controlled entirely by the control of the transistor geometry ratios. Resistor 18 determines the value of bias current I and this current value is not critical. The only restriction is that the bias current be larger than the magnitude of the largest input signal current. Power supply noise and fluctuation are rejected at the output of the rectifier so long as this bias current I is larger than the minimum value. The reference voltage at terminal 42 may be varied over a wide range. For example, for the polarity shown, terminal 42 of the circuit of FIG. 2 may be referenced freely from $2V_{BE}$ above the voltage at terminal 32 to $1V_{BE}$ more negative than the voltage at terminal 16. If a current output only is desired at terminal 38, the supply voltage across terminals 16 and 32 need be no greater than $3V_{BE}$ or approximately two volts for the circuit of FIG. 2 to operate.

While the circuits of FIGS. 1 and 2 produce an output signal whose magnitude is equal to the input signal magnitude, it should be appreciated that the relative geometry of the devices used in these circuits may be scaled to produce an output signal whose magnitude may be greater or less than the input signal magnitude.

In the circuits of FIGS. 1 and 2, load 40 has been a source of current to node 31. If it is desired to have the load element sink current, the load only need be modified to further include an additional current mirror amplifier for inversion purposes. In its simplest form, this mirror would be a two-device PNP circuit.

What is claimed is:

1. A circuit for translating an alternating input signal current to a load current comprising, in combination:
    first and second complementary current mirror amplifiers, each having an input current path and first and second output current paths through each of which flows a current proportionally related to its respective input current, said first current mirror amplifier connected to its output current paths to the corresponding paths of said second current mirror amplifier;
    means for applying a quiescent current to the input current paths of each of said current mirror amplifiers;
    means for applying said input signal current to said input current path of said second current mirror amplifier for thereby conditioning both output paths of said second current mirror amplifier to accept an amount of current proportional to the total current flowing through the input current path of said second current mirror amplifier;
    a third current path connected in shunt with said second current path of said second current mirror amplifier;
    means coupled to the first output current path of said second current mirror amplifier and to said third current path, responsive to the conditioning of said first output current path of the second current mirror amplifier to accept more current than the first output current path of the first current mirror amplifier can provide for cutting off said third current path, and responsive to the conditioning of the first output current path of the second current mirror amplifier to accept less current than the first output current path of the first current mirror provides for closing the third current path; and
    a load circuit connected to the second current path of the second current mirror amplifier and to said third current path for supplying a flow of current to the one of these paths demanding more current than the second current path of the first current mirror amplifier can provide.

2. The combination recited in claim 1 wherein the input current path of said first current mirror amplifier is connected to and supplies its quiescent current to the input current path of said second current mirror amplifier.

3. The combination of claim 1 further including a third current mirror amplifier having an input and an output current path, said third current path comprising the output current path of said third current mirror amplifier and said means responsive to the conditioning of said first output current path comprising said input current path of said third current mirror amplifier.

4. The combination recited in claim 1 where said first current mirror amplifier further includes a third output current path coupled to the input current path of said second current mirror amplifier and supplying its output current as the quiescent input current to said second current mirror amplifier.

5. The combination recited in claim 1, further including a circuit common terminal, and wherein said second current mirror amplifier first output current path comprises the collector-emitter path of a transistor, the emitter of said transistor connected to said circuit common terminal, said transistor further including a base region, further including means for quiescently maintaining said base region at a first potential with respect to said circuit common terminal.

6. The combination recited in claim 5, further including means for preventing said first potential from exceeding the potential at the collector of said transistor.

7. The combination recited in claim 6 wherein said means for preventing comprises a second transistor of the same conductivity type as the first-mentioned transistor and having base, collector and emitter regions, the collector-emitter path of said second transistor serially-connected between said second current mirror amplifier first output current path and said first-mentioned transistor collector-emitter path and poled in the same direction as said first-mentioned transistor, the emitter of said second transistor connected to the collector of said first-mentioned transistor and further including means for maintaining said second transistor base at a second potential, said second potential in excess of said first potential.

8. The combination recited in claim 7 further including a third current mirror amplifier having an input current path coupled between said circuit common terminal and the collector electrode of said second transistor, said means responsive to the conditioning of said first output current path comprising said input current path, said third current mirror also having an output current path comprising said third current path.

9. The combination recited in claim 8 further including a diode serving as the connection between said third current mirror amplifier input current path and said circuit common terminal.

10. The combination as set forth in claim 1 wherein said input current path of said second current mirror amplifier comprises a first diode, wherein the first output current path of said second current mirror amplifier comprises the emitter-to-collector path of a transistor, said transistor also having a base-emitter junction, said first diode being connected in the forward direction, across said junction, further including a second diode connected at one of its electrodes to the electrode of the first diode at the emitter electrode of said transistor, like-electrode-to-like-electrode, and a signal source connected between the other electrodes of said first and second diodes.

11. A circuit for translating a signal current comprising, in combination:
 a constant current source;
 a first current path receptive of the current supplied by said source;
 a second current path receptive of the current supplied by said source;
 load means;
 a second current source, connected to supply current to said first and second current paths, through said load means; and
 means responsive to the signal current when of one sense for opening said second current path and conditioning said first current path to accept more current than said constant current source provides, whereby the remainder of said current flows from said second current source through said load means to said first current path, and responsive to the signal current when of opposite sense for conditioning said first current path to accept less current than said constant current source provides, and for closing said second current path and conditioning it to accept more than the difference between the amount of current provided by said constant current source and that accepted by said first current path, whereby the remainder of said current flows from said second current source through said load means to said second current path.

12. A circuit as set forth in claim 11, further including a first current mirror amplifier, said second current path comprising the output circuit of said current mirror amplifier, said output circuit being connected in shunt with said first path, and said means responsive to the signal current comprising the input circuit to said current mirror amplifier.

13. A circuit for translating an input signal current to a load current comprising, in combination:
 a first current mirror amplifier comprising a first common terminal, a first input terminal and first and second output terminals, two transistors of the same conductivity type, each having base, emitter and collector electrodes, connected at their emitter electrodes to said common terminal, at their base electrodes to said input terminal, and at their respective collector electrodes to said first and second output terminals, respectively, and first diode means connected between said common and input terminals, in the same polarity as the base-emitter paths of said transistors;
 a second current mirror amplifier comprising a second common terminal, a second input terminal, and first and second output terminals connected to said first and second output terminals, respectively, of said first current mirror amplifier, said second current mirror amplifier including two transistors of opposite conductivity type to the transistors of said first current mirror amplifier, each having base, emitter and collector electrodes, each connected at its emitter electrode to said second common terminal and at its base electrode to said second input terminal, and the respective collector electrodes of said transistors of said second current mirror amplifier being connected to said first and second output terminals of said second current mirror amplifier, respectively, said second current mirror amplifier including also diode means connected between said second common terminal and said second input terminal, and poled in the same direction as the base-to-emitter paths of said transistors of said second current mirror amplifier;
 means for applying a quiescent current between the input and common terminals of each of said current mirror amplifiers;
 means for applying said input signal current to said second input terminal, thereby conditioning said second current mirror amplifier to produce a flow of output current at its first and second output terminals proportional to the total current flowing through said second input terminal;
 a third current mirror amplifier having a third input terminal coupled to the first output terminal of said first current mirror amplifier, a third common terminal coupled to said second common terminal, and an output terminal coupled to the second output terminal of said first current mirror amplifier, said third current mirror amplifier including a transistor of the same conductivity type as the transistors of said second current mirror amplifier having base, emitter and collector electrodes, connected at its base electrode to said third imput terminal, at its emitter electrode to said third common terminal, and at its collector electrode to the output terminal of said third current mirror amplifier, and having also diode means connected between said third input terminal and said third common terminal, and poled in the same direction as the base-emitter path of the transistor of said third current mirror amplifier;
 a terminal for a reference voltage; and
 load means connected between said terminal for said reference voltage and said second output terminal of said second current mirror amplifier.

14. A circuit as set forth in claim 13, further including resistive means connecting said first and second input terminals, and wherein said means applying a quiescent current comprises a voltage source connected between said first and second common terminals.

15. A circuit as set forth in claim 14 further including in said first current mirror amplifier, a third output terminal connected to said second input terminal, a third transistor of the same conductivity type as the other transistors of said first current mirror amplifier, having base, emitter and collector electrodes, connected at its emitter electrode to said first common terminal, at its collector electrode to said third output terminal and at its base electrode to said first input terminal, said third transistor comprising said means for supplying quiescent current to the second current mirror amplifier, and further including a circuit including resistive means connecting said first input terminal to said second common terminal for providing a path for the quiescent current of said first current mirror amplifier.

16. A circuit as set forth in claim 13, further including:

means coupled to said first output terminal of said second current mirror amplifier for maintaining that terminal at a potential $1V_{BE}$ above that at said second common terminal; and means responsive to conduction between said third input terminal and said second common terminal for maintaining said third common terminal at a potential $1V_{BE}$ above that of said second common terminal, where $1V_{BE}$ is the forward offset voltage across a conducting semiconductor junction.

* * * * *

UNITED STATES PATENT OFFICE
CERTIFICATE OF CORRECTION

PATENT NO. : 3,989,997

DATED : November 2, 1976

INVENTOR(S) : Adel Abdel Aziz Ahmed

It is certified that error appears in the above-identified patent and that said Letters Patent are hereby corrected as shown below:

Column 5, line 47, "to" (first occurrence) should read --at--

Column 8, line 35, "imput" should read --input--

Signed and Sealed this

Twenty-sixth Day of April 1977

[SEAL]

Attest:

RUTH C. MASON
*Attesting Officer*

C. MARSHALL DANN
*Commissioner of Patents and Trademarks*